US009088289B2

(12) United States Patent
Choi et al.

(10) Patent No.: US 9,088,289 B2
(45) Date of Patent: Jul. 21, 2015

(54) SYSTEM AND METHOD FOR INCREASING A VOLTAGE RANGE ASSOCIATED WITH A VOLTAGE CONTROLLED OSCILLATOR

(71) Applicant: NVIDIA Corporation, Santa Clara, CA (US)

(72) Inventors: Dong-Myung Choi, Cupertino, CA (US); Anuradha Subbaraman, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/861,323

(22) Filed: Apr. 11, 2013

(65) Prior Publication Data

US 2014/0306775 A1 Oct. 16, 2014

(51) Int. Cl.
*H03L 5/00* (2006.01)

(52) U.S. Cl.
CPC .......................................... *H03L 5/00* (2013.01)

(58) Field of Classification Search
USPC ............................... 331/57, 34, 109, 183, 186
See application file for complete search history.

(56) References Cited

U.S. PATENT DOCUMENTS

| 6,229,403 | B1 * | 5/2001 | Sekimoto ......................... 331/57 |
| 6,275,116 | B1 | 8/2001 | Abugharbieh et al. |
| 6,621,360 | B1 | 9/2003 | Xu et al. |
| 8,604,884 | B2 * | 12/2013 | Coban et al. ..................... 331/57 |
| 8,604,885 | B2 * | 12/2013 | Kouyama ......................... 331/57 |

* cited by examiner

*Primary Examiner* — Joseph Chang
(74) *Attorney, Agent, or Firm* — Zilka-Kotab, PC

(57) ABSTRACT

A system and method are provided for increasing a voltage range associated with a voltage controlled oscillator. A voltage-to-current converter is provided. Additionally, a current controlled oscillator is provided that is in communication with the voltage-to-current converter. Further, at least one circuit component is provided that is in communication with the voltage-to-current converter for increasing a voltage range with which the apparatus operates as a voltage controlled oscillator.

14 Claims, 13 Drawing Sheets

SYSTEM AND METHOD FOR INCREASING A VOLTAGE RANGE ASSOCIATED WITH A VOLTAGE CONTROLLED OSCILLATOR

FIELD OF INVENTION the present invention relates to oscillators, and more particularly to increasing voltage ranges associated with voltage controlled oscillators.

BACKGROUND

A voltage controlled oscillator (VCO) is an electronic oscillator with an oscillation frequency controlled by a voltage input. The applied input voltage determines the oscillation frequency, consequently, modulating signals applied to control input may cause frequency modulation (FM) or phase modulation (PM). In some cases, a voltage controlled oscillator may be part of a phase-locked loop.

Traditional voltage controlled oscillators are inadequate for obtaining a suitable frequency for systems at voltages close to or lower than a threshold voltage of a main transconductance cell (GM cell) associated with the voltage controlled oscillator. There is thus a need for addressing these and/or other issues associated with the prior art.

SUMMARY

A system and method are provided for increasing a voltage range associated With a voltage controlled oscillator. A voltage-to-current converter is provided. Additionally, a current controlled oscillator is provided that is in communication with the voltage-to-current converter. Further, at least one circuit component is provided that is in communication with the voltage-to-current converter for increasing a voltage range with which the apparatus operates as a voltage controlled oscillator.

DETAILED DESCRIPTION

Figure 1:
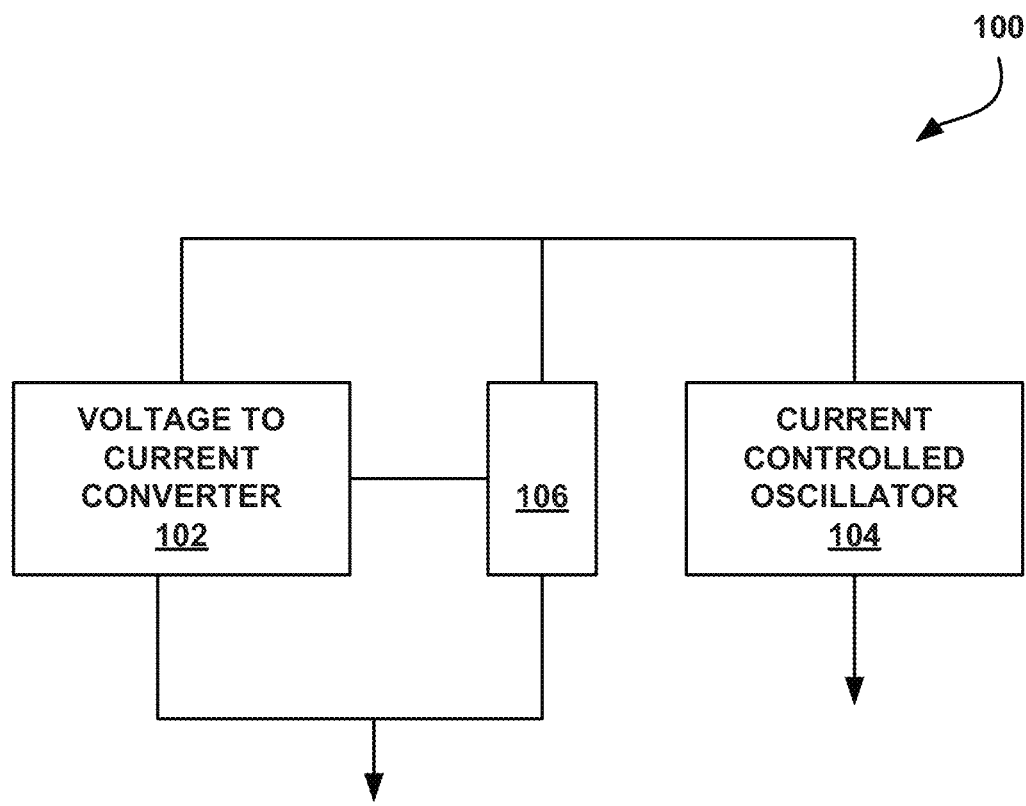
FIG. 1 shows an apparatus for increasing a voltage range associated with a voltage controlled oscillator, in accordance with one embodiment.

FIG. 1 shows an apparatus 100 for increasing a voltage range associated with a voltage controlled oscillator, in accordance with one embodiment.

As shown, the apparatus 100 includes a voltage-to-current converter 102. Additionally, the apparatus 100 includes a current controlled oscillator 104 in communication with the voltage-to-current converter 102. Further, the apparatus 100 includes at least one circuit component 106 in communication with the voltage-to-current converter 102 for increasing a voltage range with which the apparatus 100 operates as a voltage controlled oscillator. In the context of the present description, a voltage controlled oscillator refers to an electronic oscillator with an oscillation frequency that is capable of being controlled by a voltage input.

In various embodiments, the at least one circuit component 106 may include one or more components. For example, in one embodiment, the at least one circuit component 106 may include one or more transistors. In one embodiment, the one or more transistors may include a PMOS transistor. Further, in one embodiment, the at least one circuit component 106 may include an NMOS transistor.

Still yet, in one embodiment, the at least one circuit component 106 may include a transistor including a gate in communication with an input of an operational amplifier of the voltage-to-current converter 102. Of course, in various embodiments, the voltage-to-current converter 102 may include any number of components including one or more operational amplifiers, one or more resisters, one or more transistors, and/or one or more other components.

For example, in one embodiment, the voltage-to-current converter 102 may include an operational amplifier including a first input, a second input and an output. Additionally, in one embodiment, the voltage-to-current converter 102 may include a first transistor including a source, a drain, and a gate in communication with the output of the operational amplifier. In one embodiment, the voltage-to-current converter 102 may also include a resistor with a first terminal that is grounded and a second terminal in communication with the second input of the operational amplifier and the source of the first transistor.

In addition, in one embodiment, the at least one circuit component 106 may include a second transistor including a gate in communication with the first input of the operational amplifier, a source that is grounded, and a drain that is in communication with a drain of the first transistor. Of course, in various embodiments, the at least one circuit component 106 may include any number of components in a variety of configurations, such that the at least one circuit 106 is operable for increasing an upper limit of the voltage range with which the apparatus 100 operates as the voltage controlled oscillator and/or such that the at least one circuit 106 is operable for decreasing a lower limit of the voltage range with which the apparatus 100 operates as the voltage controlled oscillator.

Still yet, in one embodiment, the apparatus 100 may include an offset current source in communication with the at least one current component 106. In various embodiments, the offset current source may include any number of components for providing an offset current. In one embodiment, the current controlled oscillator 104 may include the offset current source. Of course, in various embodiments, the current controlled oscillator 104 may include any number of components in various configurations.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2A:
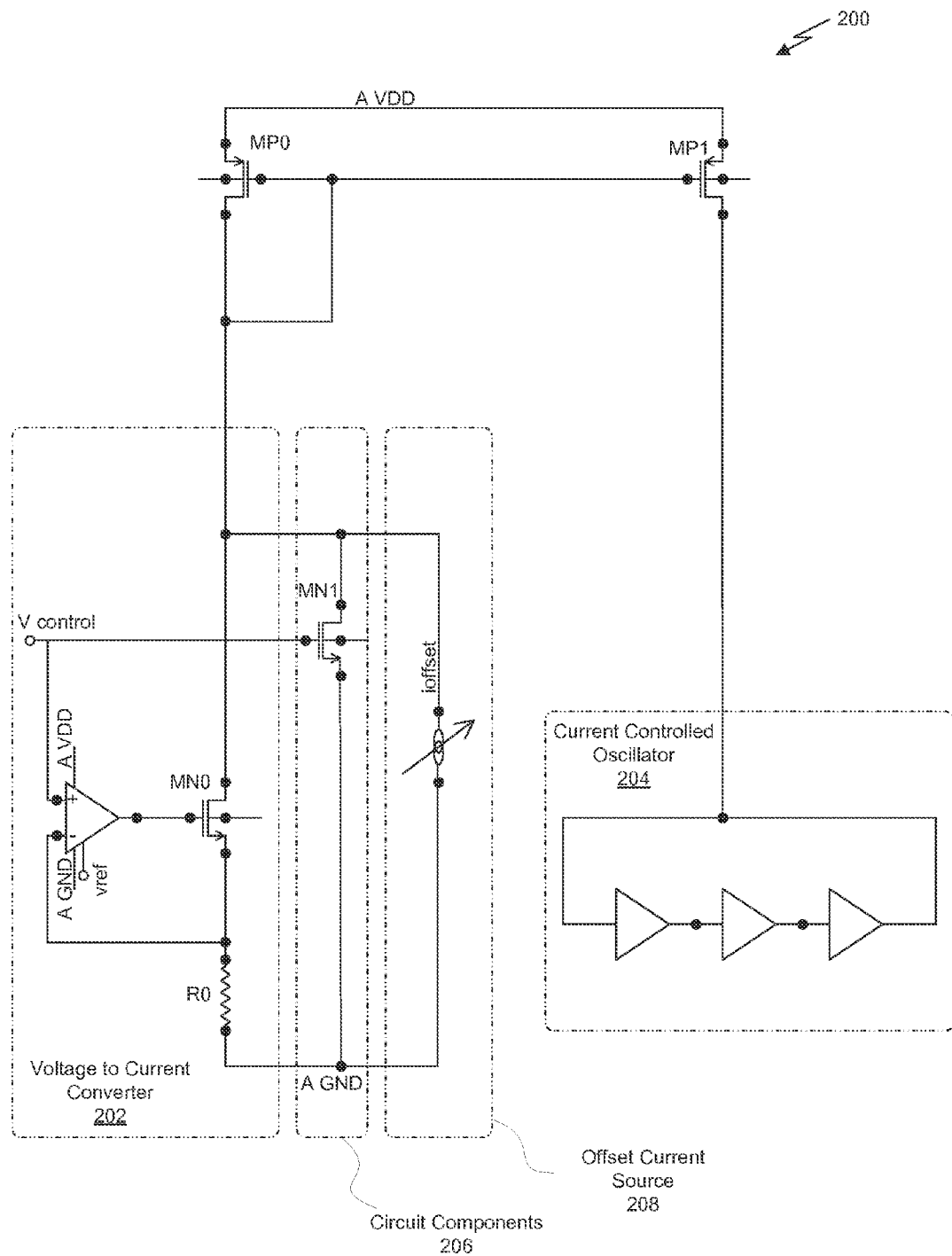
FIG. 2A shows a voltage controlled oscillator system with increased voltage range, in accordance with one embodiment.

FIG. 2A shows a voltage controlled oscillator system 200 with increased voltage range, in accordance with one embodiment. As an option, the system 200 may be implemented in the context of the previous Figure and/or any subsequent Figure(s). Of course, however, the system 200 may be implemented in any desired environment, It should also be noted that the aforementioned definitions may apply during the present description.

As shown, the system 200 includes a voltage-to-current converter 202. Additionally, the system 200 includes a current controlled oscillator 204 in communication with the voltage-to-current converter 202. Further, the system 200 includes at least one circuit component 206 in communication with the voltage-to-current converter 202 for increasing a voltage range with which the system 200 operates as a voltage controlled oscillator.

In one embodiment, the operating voltage range for the voltage controlled oscillator may be extended to a sub-band architecture (e.g. as depicted in FIG. 2A, etc.). Of course, such techniques may be implemented to extend the operating voltage range for any voltage controlled oscillator system.

As shown, the voltage controlled oscillator system 200 includes an operational amplifier based voltage-to-current loop capable of operating in parallel with a GM cell. In one embodiment, the operational amplifier based voltage to current conversion may be enabled utilizing the voltage-to-current converter 202, the at least one circuit component 206, and/or the offset current source 208 to operate at lower control voltages than traditional GM conversion implementations and to provide extended operating ranges.

In operation, at larger control voltages, the operational amplifier output may rail, thereby giving a fixed offset current. In these cases, in one embodiment, the sub-bands may be obtained by adjusting offset currents (e.g. "ioffset," etc.) generated by the offset current source 208, which may be digitally controlled. With further reference to FIG. 2A, a transistor MN1, i.e., the at least one circuit component 206, may be utilized to function as the main GM device. In addition, a transistor MN0 may function to enable the low control voltage operation. At low control voltages, the current through the transistor MP0 is mainly obtained from the transistor MN0 in the operational amplifier loop and from the digitally controlled offset current ("ioffset"). At higher control voltages, the current through the transistor MP0 is a sum of the fixed offset current through the transistor MN0, the control voltage based current through the transistor MN1, and the digitally controlled offset current ("ioffset").

Figure 2B:
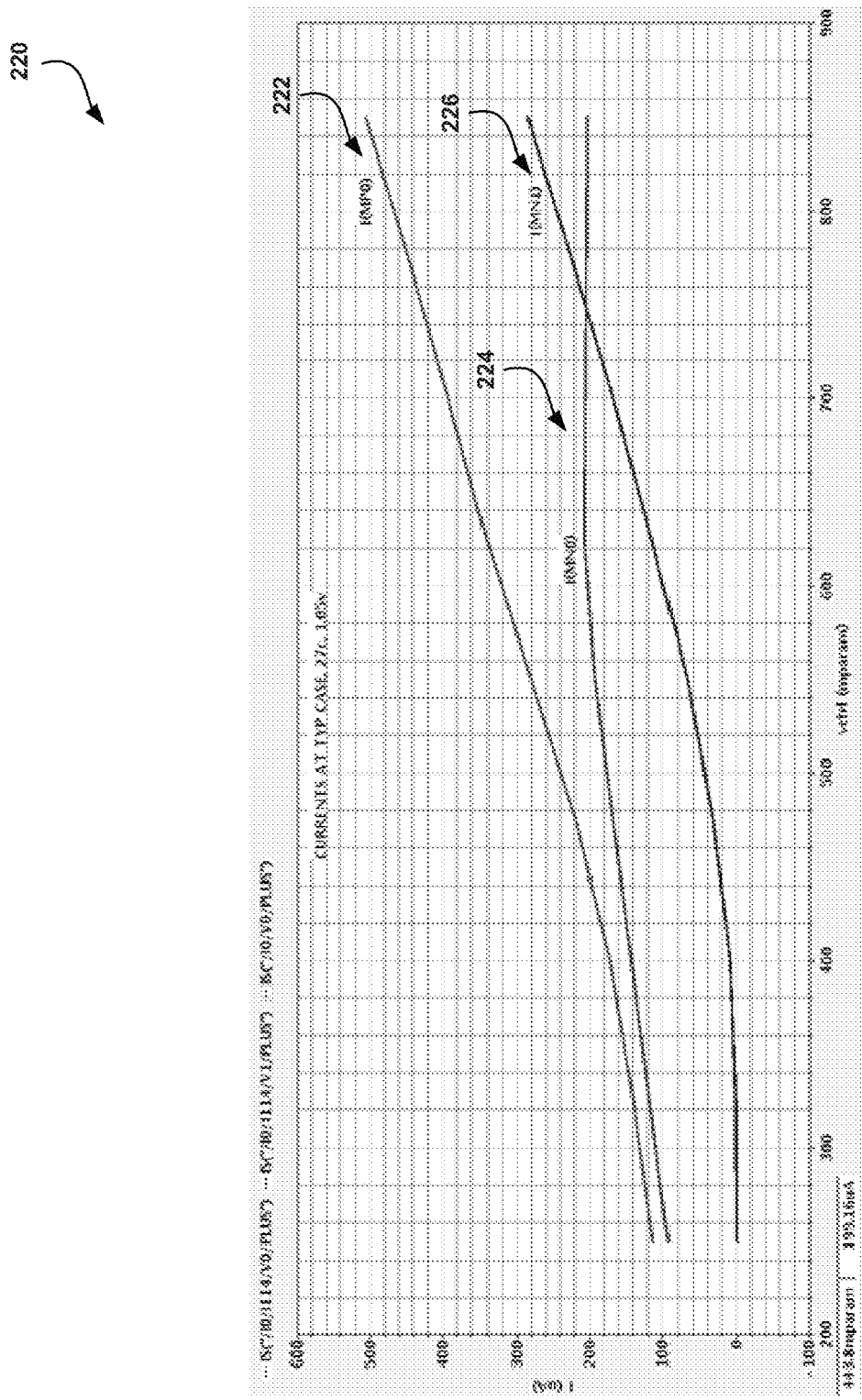
FIG. 2B shows a chart illustrating DC voltage-current curves associated with the system of FIG. 2A, in accordance with one embodiment.

FIG. 2B shows a chart 220 illustrating DC voltage-current curves associated with the system 200, in accordance with one embodiment. In the chart 220, the current from the operational amplifier based transistor MN0 and the regular transistor MN1 are plotted along with their sum. The chart 220 shows currents plotted for I(MP0) 222, which is a sum of I(MN0) 224 and I(MN1) 226. The current obtained functions to provide a healthy frequency response at low control voltages.

Figure 2C:
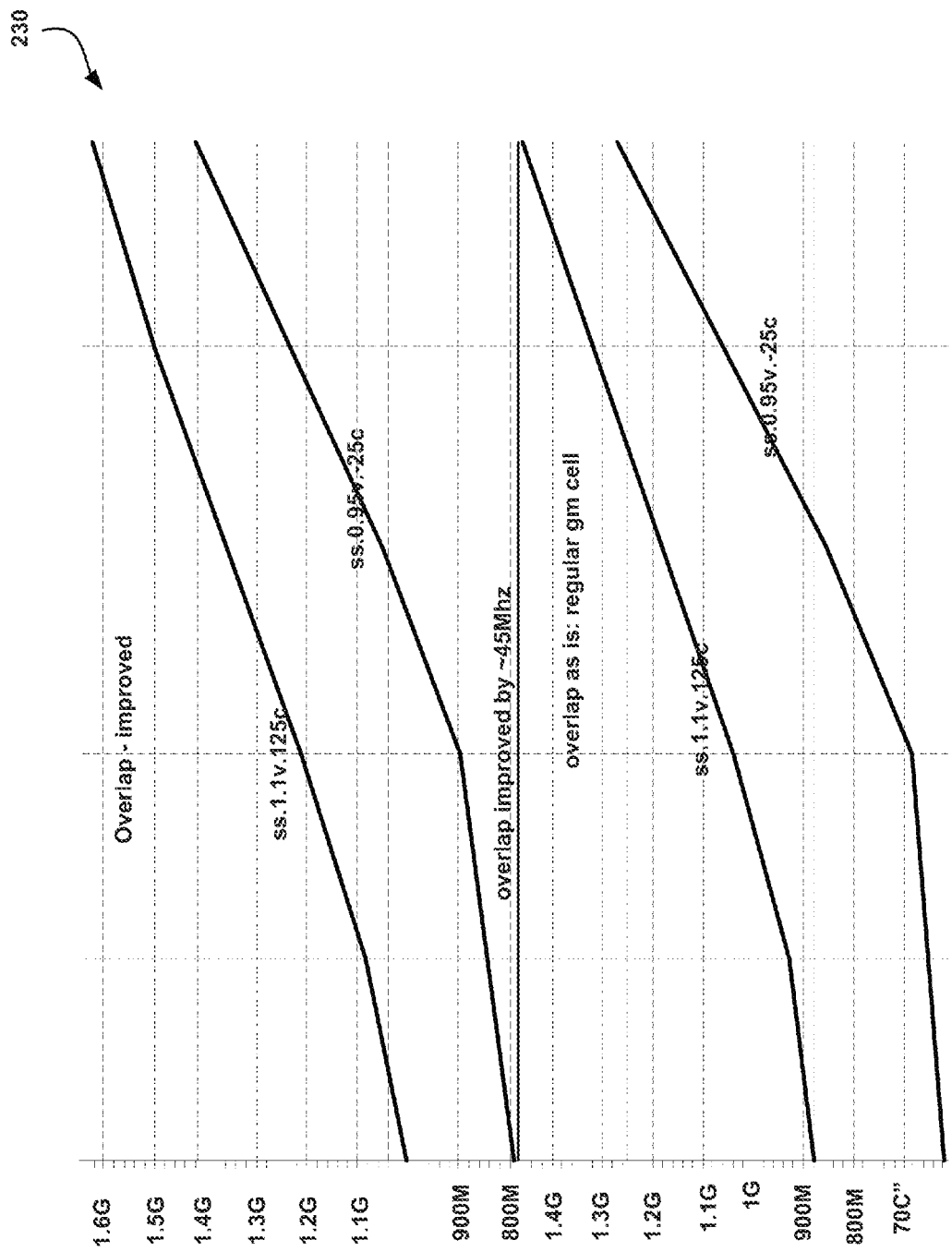
FIG. 2C shows a chart illustrating frequency hand overlap associated with the system of FIG. 2A, in accordance with one embodiment.

FIG. 2C shows a chart 230 illustrating band overlap associated with the system 200, in accordance with one embodiment. The chart 230 illustrates how the added working range at lower control voltages functions to obtain an increased overlap over voltage and temperature variations for a chosen band. As shown, the system 200 allows for very desirable low KVCOsub-band architectures, where the same band has to cover an adequate frequency range over the supply and temperature variations, assuming that there is calibration for process variations in place. Furthermore, the chart 230 illustrates a band overlap at a slow process corner, where the increase is more pronounced, for control voltage range of 300 mv-800 mv with a supply of 1.05 v in this case.

Figure 2D:
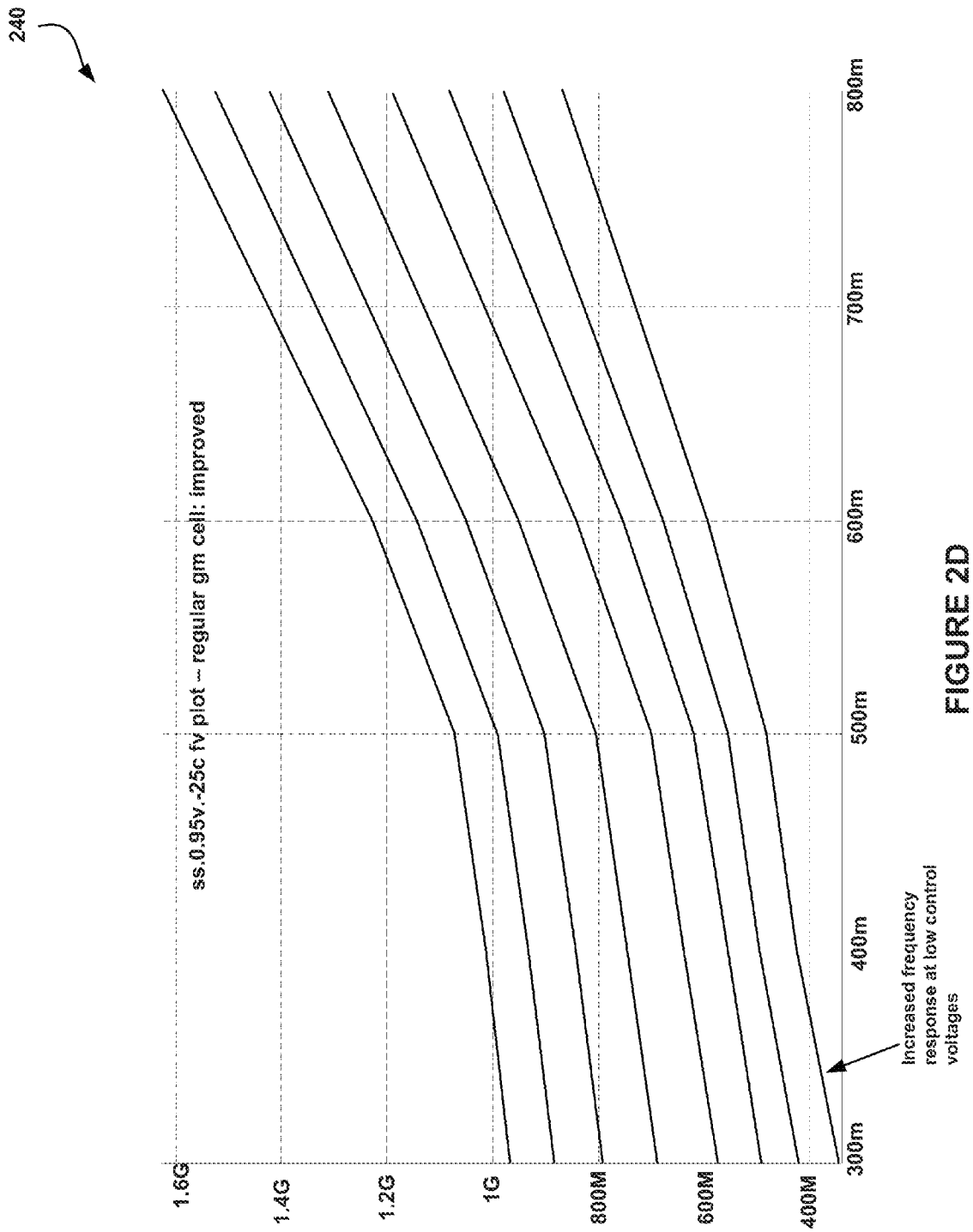
FIG. 2D shows a chart illustrating frequency-voltage curves associated with the system of FIG. 2A, in accordance with one embodiment.

FIG. 2D shows a chart 240 illustrating frequency-voltage curves associated with the system 200, in accordance with one embodiment. The chart 240 illustrates the frequency-voltage curves generated utilizing the system 200, with an extended range GM cell used in the ring voltage controlled oscillator at slow process corner, −25 C, low supply. As shown, the frequency-voltage curves extend down to 300 mv.

Figure 2E:
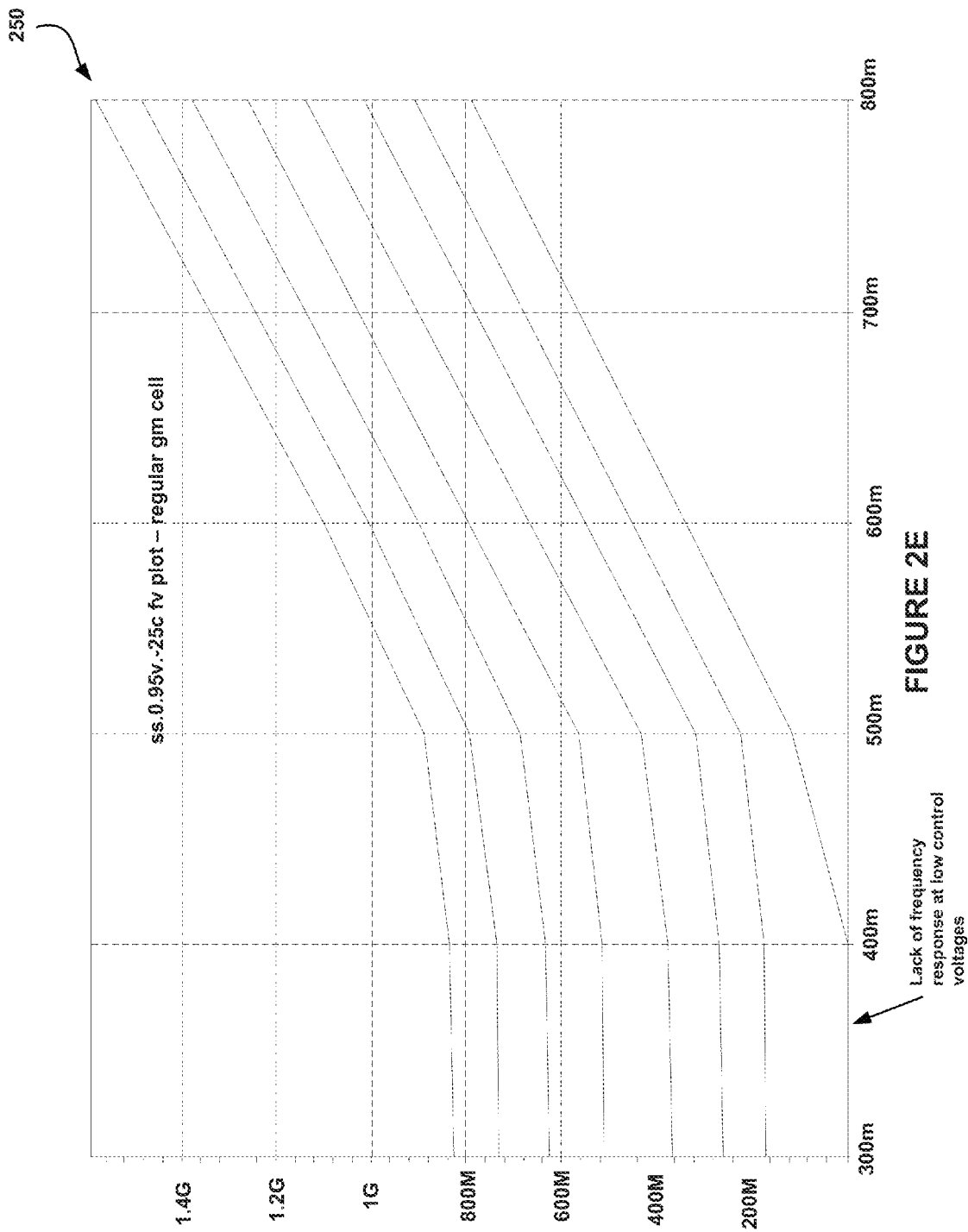
FIG. 2E shows a chart illustrating frequency-voltage curves associated with a conventional voltage controlled oscillator system.

In contrast, FIG. 2E shows a chart 250 illustrating frequency-voltage curves associated with a conventional voltage controlled oscillator system. The chart 250 shows frequency-voltage curves for a regular GM (e.g. a conventional voltage controlled oscillator system, etc.) used in a ring voltage controlled oscillator at slow, −25 C, low supply. As shown, the conventional voltage controlled oscillator system is un-usable at low control voltages less than 450 mv.

Of course, as noted above, in various embodiments, the voltage controlled oscillator system 200 with increased voltage range, may have various configurations including various components.

Figure 3A:
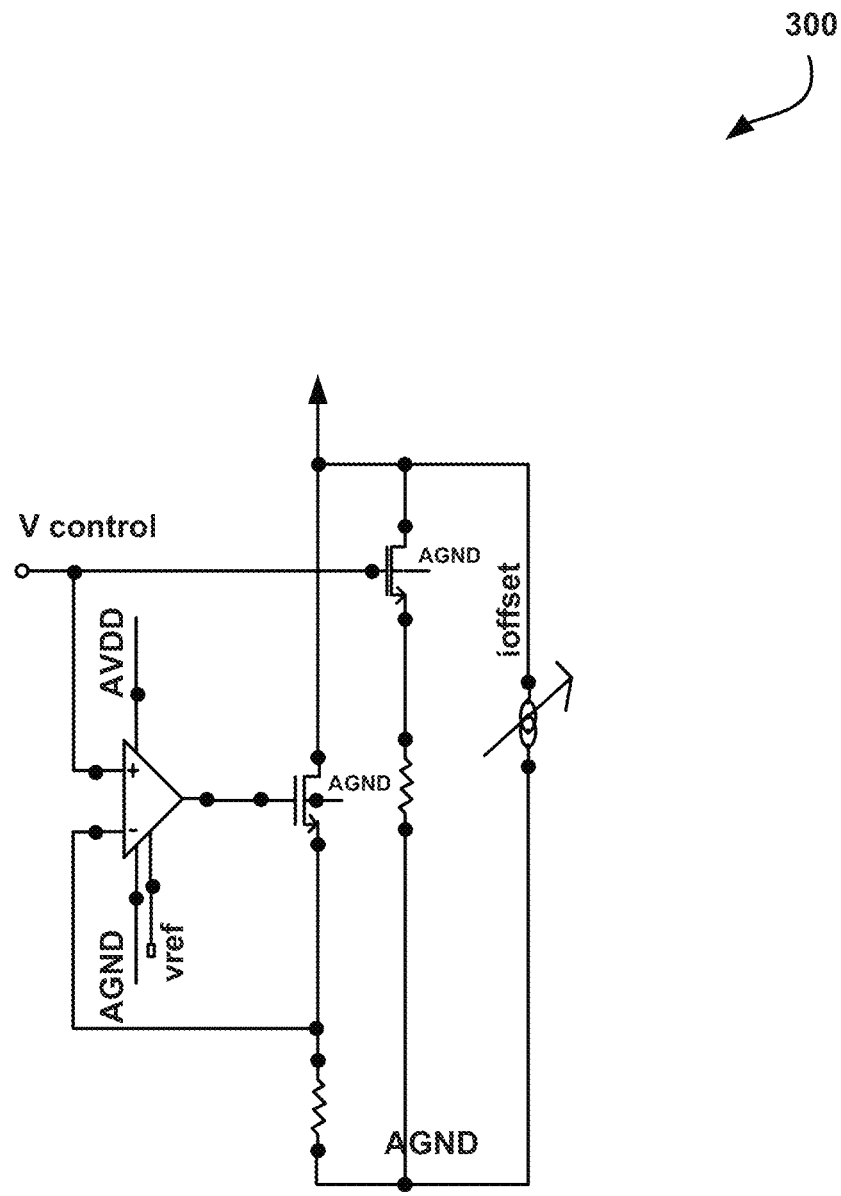
FIG. 3A shows an apparatus for increasing a voltage range associated with a voltage controlled oscillator, in accordance with another embodiment.

For example, FIG. 3A shows an apparatus 300 for increasing a voltage range associated with a voltage controlled oscillator, in accordance with another embodiment. As an option, the apparatus 300 may be implemented in the context of the previous Figures and/or any subsequent Figure(s). Of course, however, the apparatus 300 may be implemented in any desired environment. It should also be noted that the aforementioned definitions may apply during the present description.

As shown, the apparatus 300 may include an operational amplifier, two or more transistors, two or more resistors, and an offset current source. In one embodiment, the apparatus 300 may be utilized in conjunction with a sub-band architecture (e.g. as depicted in FIG. 2A, etc.). Of course, the apparatus 300 may be implemented to extend the operating voltage range for any voltage controlled oscillator system.

Figure 3B:
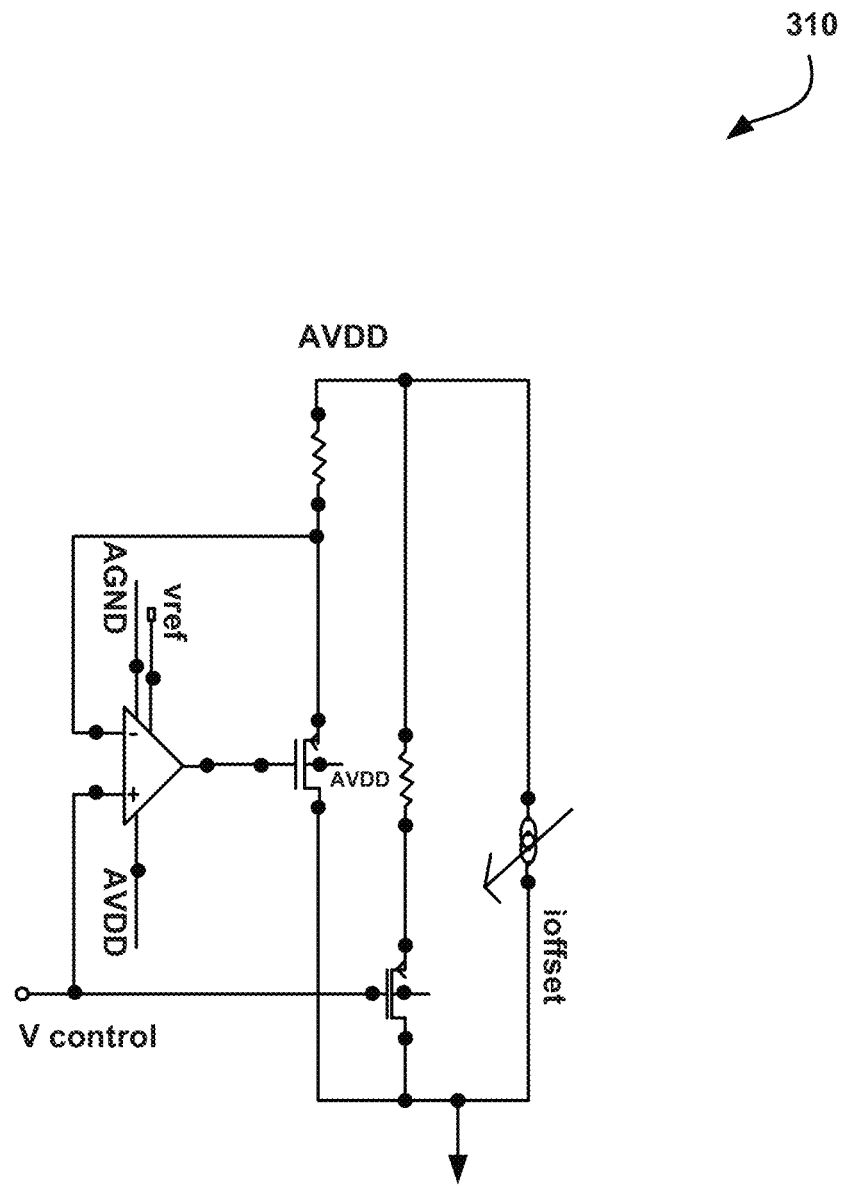
FIG. 3B shows an apparatus for increasing a voltage range associated with a voltage controlled oscillator, in accordance with another embodiment.

As another example, FIG. 3B shows an apparatus 310 for increasing a voltage range associated with a voltage controlled oscillator, in accordance with another embodiment. As an option, the apparatus 310 may be implemented in the context of the previous Figures and/or any subsequent Figure(s). Of course, however, the apparatus 310 may be implemented in any desired environment. It should also be noted that the aforementioned definitions may apply during the present description.

As shown, the apparatus 310 may include an operational amplifier, two or more transistors, two or more resistors, and an offset current source. In one embodiment, the apparatus 310 may be utilized in conjunction with a sub-band architecture (e.g. as depicted in FIG. 2A, etc.). Of course, the apparatus 310 may be implemented to extend the operating voltage range for any voltage controlled oscillator system.

Figure 3C:
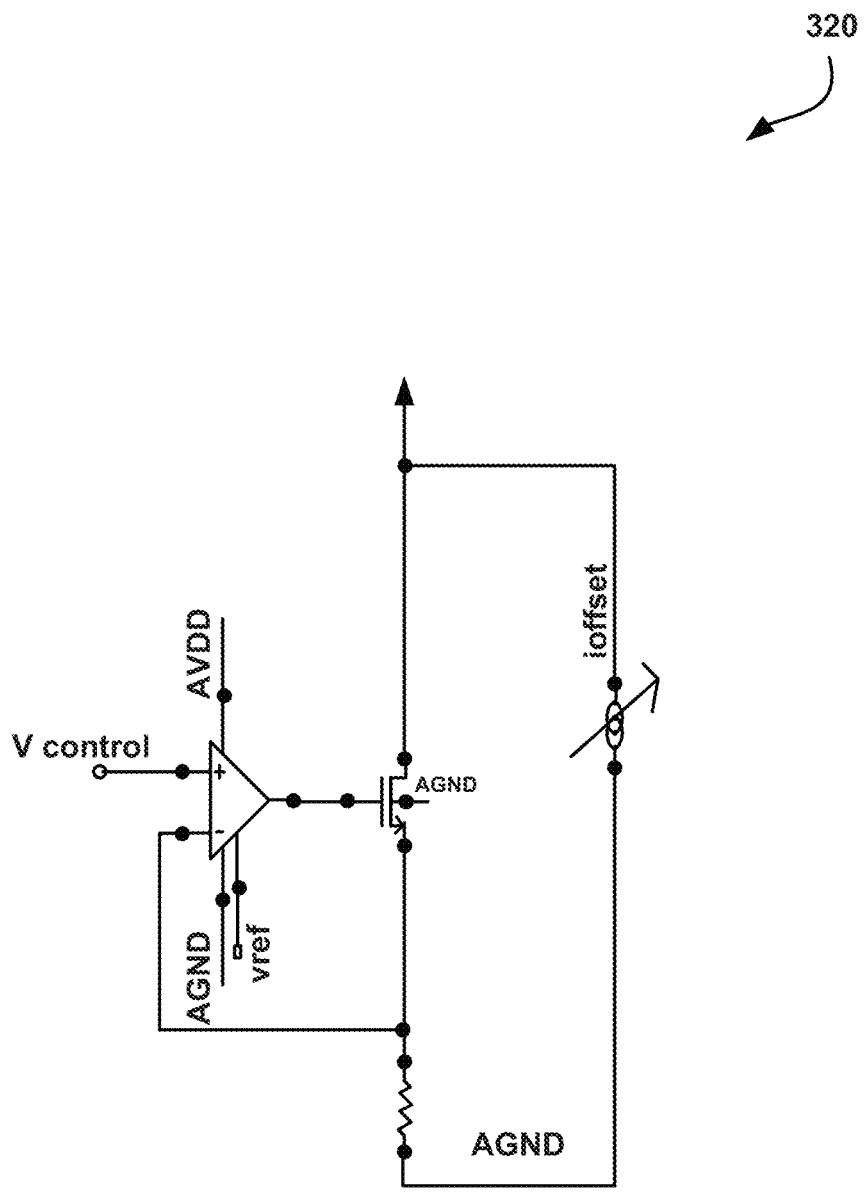
FIG. 3C shows an apparatus for increasing a voltage range associated with a voltage controlled oscillator, in accordance with another embodiment.

As another example, FIG. 3C shows an apparatus 320 for increasing a voltage range associated with a voltage controlled oscillator, in accordance with another embodiment. As an option, the apparatus 320 may be implemented in the context of the previous Figures and/or any subsequent Figure(s). Of course, however, the apparatus 320 may be implemented in any desired environment. It should also be noted that the aforementioned definitions may apply during the present description.

As shown, the apparatus 320 may include an operational amplifier, a transistor, a resistor, and an offset current source. In one embodiment, the apparatus 320 may be utilized in conjunction with a sub-band architecture (e.g. as depicted in FIG. 2A, etc.). Of course, the apparatus 320 may be implemented to extend the operating voltage range for any voltage controlled oscillator system.

Figure 3D:
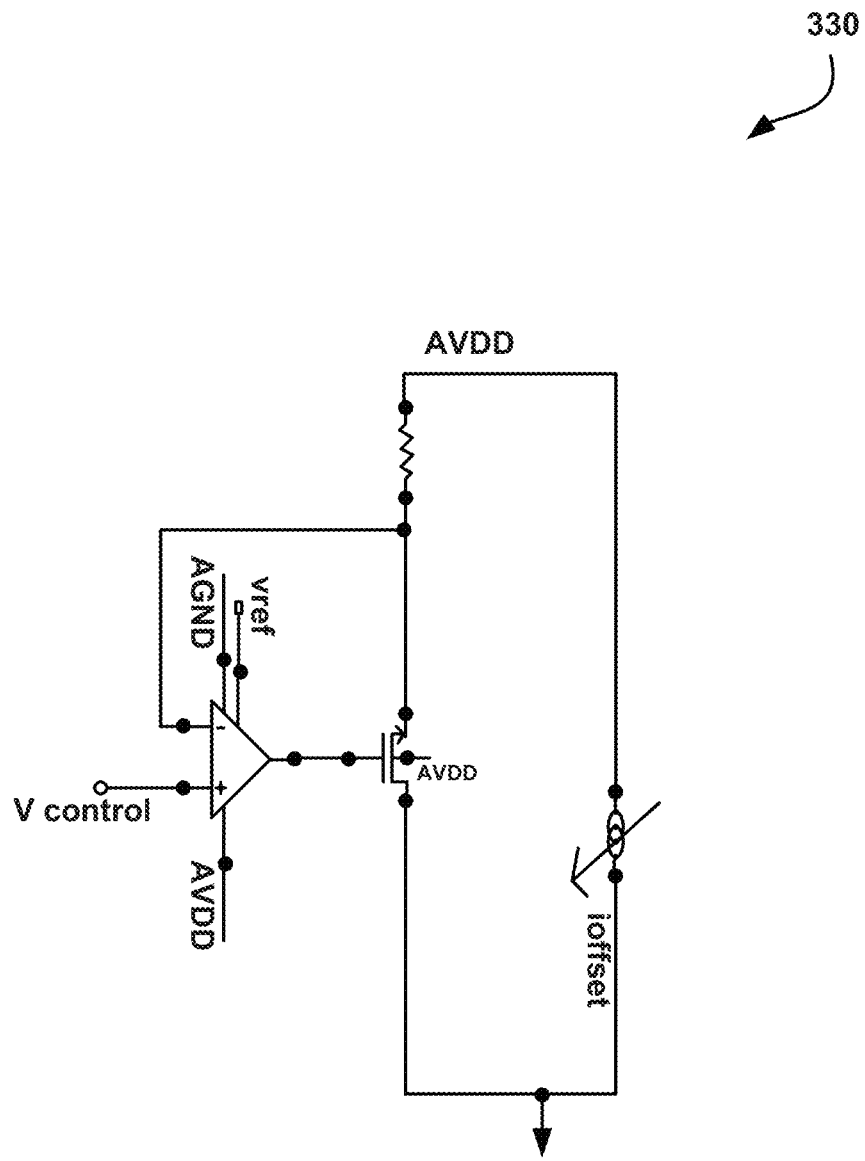
FIG. 3D shows an apparatus for increasing a voltage range associated with a voltage controlled oscillator, in accordance with another embodiment.

As another example, FIG. 3D shows an apparatus 330 for increasing a voltage range associated with a voltage controlled oscillator, in accordance with another embodiment. As an option, the apparatus 330 may be implemented in the context of the previous Figures and/or any subsequent Figure(s). Of course, however, the apparatus 330 may be implemented in any desired environment. It should also be noted that the aforementioned definitions may apply during the present description.

As shown, the apparatus 330 may include an operational amplifier, a transistor, a resistor, and an offset current source. In one embodiment, the apparatus 330 may be utilized in conjunction with a sub-band architecture (e.g. as depicted in FIG. 2A, etc.). Of course, the apparatus 330 may be implemented to extend the operating voltage range for any voltage controlled oscillator system.

Figure 3E:
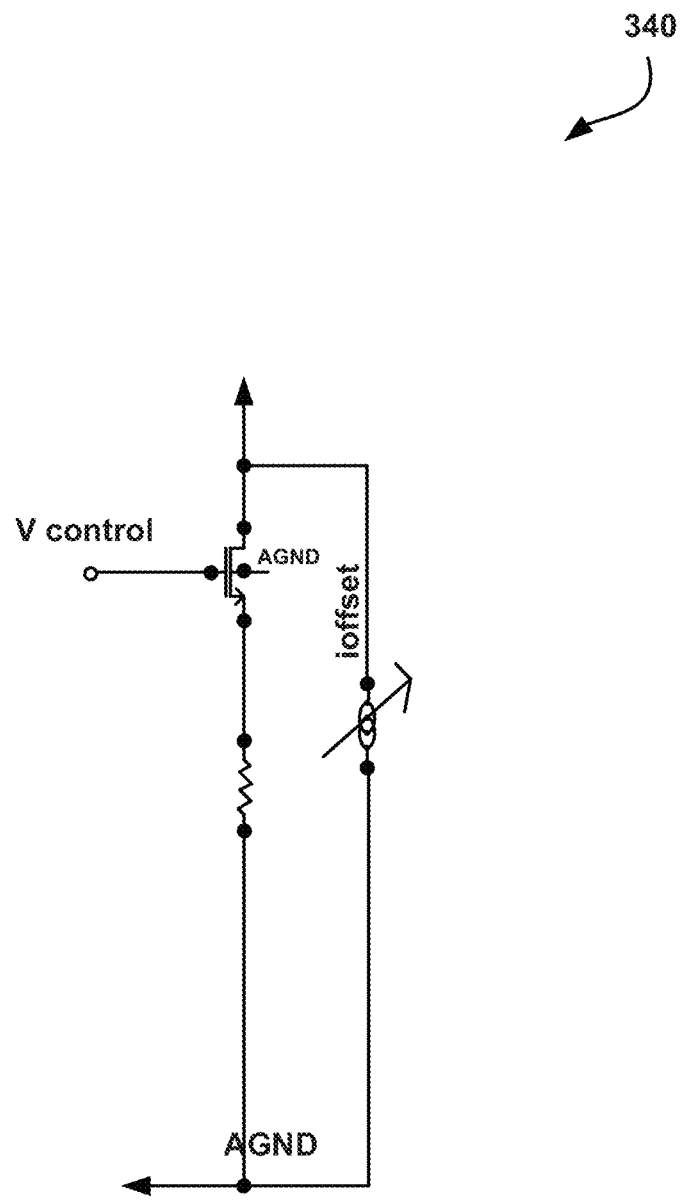
FIG. 3E shows an apparatus for increasing a voltage range associated with a voltage controlled oscillator, in accordance with another embodiment.

FIG. 3E shows an apparatus 340 for increasing a voltage range associated with a voltage controlled oscillator, in accordance with another embodiment. As an option, the apparatus 340 may be implemented in the context of the previous Figures and/or any subsequent Figure(s). Of course, however, the apparatus 340 may be implemented in any desired environment. It should also be noted that the aforementioned definitions may apply during the present description.

As shown, the apparatus 340 may include a transistor, a resistor, and an offset current source. In one embodiment, the apparatus 340 may be utilized in conjunction with a sub-band architecture (e.g. as depicted in FIG. 2A, etc.). Of course, the apparatus 340 may be implemented to extend the operating voltage range for any voltage controlled oscillator system.

Figure 3F:
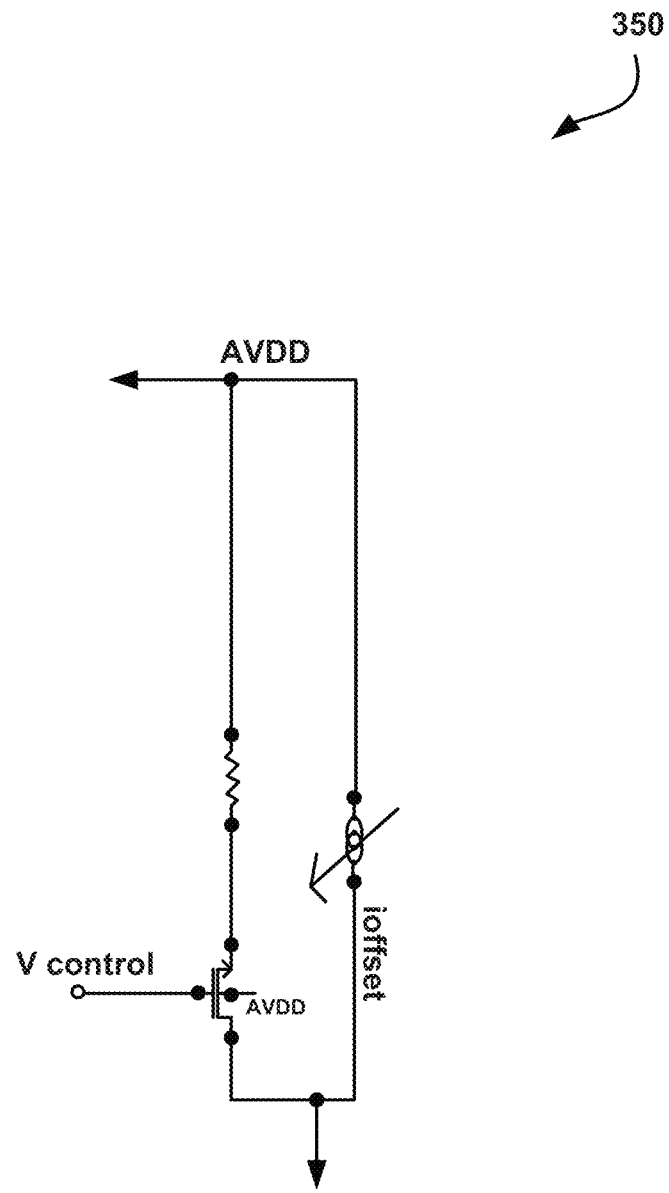
FIG. 3F shows an apparatus for increasing a voltage range associated with a voltage controlled oscillator, in accordance with another embodiment.

As yet another example, FIG. 3F shows an apparatus 350 for increasing a voltage range associated with a voltage controlled oscillator, in accordance with another embodiment. As an option, the apparatus 350 may be implemented in the context of the previous Figures and/or any subsequent Figure(s). Of course, however, the apparatus 350 may be implemented in any desired environment. It should also be noted that the aforementioned definitions may apply during the present description.

As shown, the apparatus 350 may include a transistor, a resistor, and an offset current source. In one embodiment, the apparatus 350 may be utilized in conjunction with a sub-band architecture (e.g. as depicted in FIG. 2A, etc.). Of course, the apparatus 350 may be implemented to extend the operating voltage range for any voltage controlled oscillator system.

Figure 4:
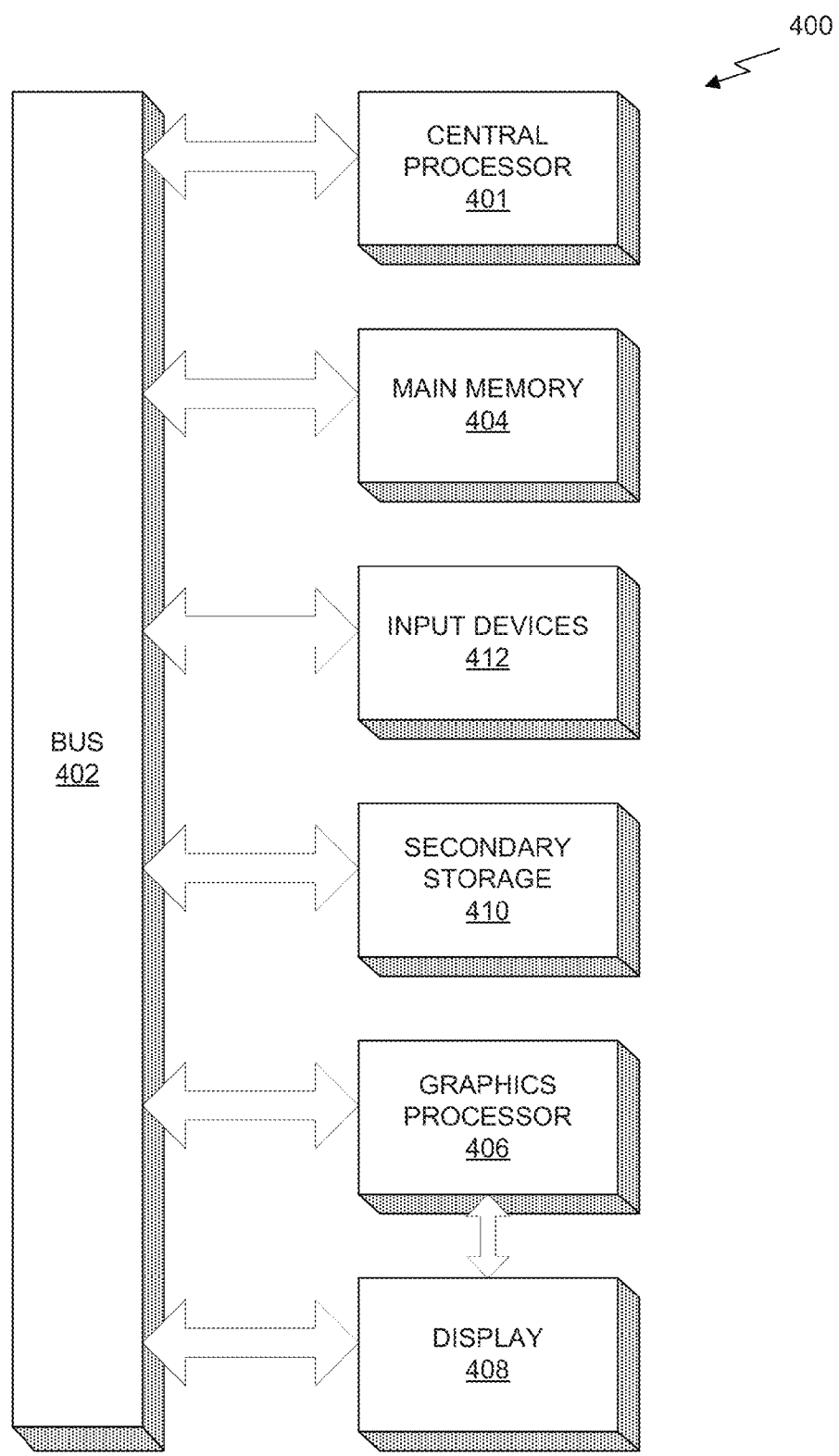
FIG. 4 illustrates an exemplary system in which the various architecture and/or functionality of the various previous embodiments may be implemented.

FIG. 4 illustrates an exemplary system 400 in which the various architecture and/or functionality of the various previous embodiments may be implemented. As shown, a system 400 is provided including at least one central processor 401 that is connected to a communication bus 402. The communication bus 402 may be implemented using any suitable protocol, such as PCI (Peripheral Component Interconnect), PCI-Express, AGP (Accelerated Graphics Port), HyperTransport, or any other bus or point-to-point communication protocol(s). The system 400 also includes a main memory 404. Control logic (software) and data are stored in the main memory 404 which may take the form of random access memory (RAM), The system 400 also includes input devices 412, a graphics processor 406, and a display 408, i.e. a conventional CRT (cathode ray tube), LCD (liquid crystal display), LED (light emitting diode), plasma display or the like. User input may be received from the input devices 412, e.g.. keyboard, mouse, touchpad, microphone, and the like. In one embodiment, the graphics processor 406 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 400 may also include a secondary storage 410. The secondary storage 410 includes, for example, a hard disk drive and/or removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 404 and/or the secondary storage 410. Such computer programs, when executed, enable the system 400 to perform various functions. The main memory 404, the storage 410, and/or any other storage are possible examples of computer-readable media.

In one embodiment, the architecture and/or functionality of the various previous figures may be implemented in the context of the central processor 401, the graphics processor 406, an integrated circuit (not shown) that is capable of at least a portion of the capabilities of both the central processor 401 and the graphics processor 406, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 400 may take the form of a desktop computer, laptop computer, server, workstation, game consoles, embedded system, and/or any other type of logic. Still yet, the system 400 may take the form of various other devices including, but not limited to a personal digital assistant (PDA) device, a mobile phone device, a television, etc.

Further, while not shown, the system 400 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
a voltage-to-current converter that includes an operational amplifier having a first input connected to a control voltage and an output connected to a gate of a first transistor;
a current controlled oscillator in communication with the voltage-to-current converter; and
at least one circuit component in communication with the voltage-to-current converter, wherein the at least one circuit component includes a second transistor having a gate connected to the control voltage.

2. The apparatus of claim 1, wherein the first transistor is an NMOS transistor.

3. The apparatus of claim 1, wherein the second transistor is an NMOS transistor.

4. The apparatus of claim 1, wherein the at least one circuit component is operable for at least one of increasing an upper limit of the control voltage or decreasing a lower limit of the control voltage.

5. The apparatus of claim 1, and further comprising an offset current source in communication with the at least one circuit component.

6. The apparatus of claim 1, wherein the voltage-to-current converter further includes a resistor with a first terminal that is grounded and a second terminal in communication with a second input of the operational amplifier and a source of the first transistor.

7. A method, comprising:
converting a voltage to current utilizing a voltage-to-current converter that includes an operational amplifier having a first input connected to a control voltage and an output connected to a gate of a first transistor, wherein the voltage-to-current converter is in communication with a current controlled oscillator; and
increasing a voltage range of the control voltage supplied to the voltage-to-current converter utilizing at least one circuit component in communication with the voltage-to-current converter, wherein the at least one circuit component includes a second transistor having a gate connected to the control voltage.

8. The method of claim 7, wherein the first transistor is an NMOS transistor.

9. The method of claim 7, wherein the second transistor is an NMOS transistor.

10. The method of claim 7, wherein the at least one circuit component is operable for at least one of increasing an upper limit of the control voltage or decreasing a lower limit of the control voltage.

11. The method of claim 7, wherein an offset current source is in communication with the at least one circuit component.

12. The method of claim 7, wherein the voltage-to-current converter further includes a resistor with a first terminal that is grounded and a second terminal in communication with a second input of the operational amplifier and a source of the first transistor.

13. A system, comprising:
a processor including:
a voltage-to-current converter that includes an operational amplifier having a first input connected to a control voltage and an output connected to a gate of a first transistor;
a current controlled oscillator in communication with the voltage-to-current converter; and
at least one circuit component in communication with the voltage-to-current converter, wherein the at least one circuit component includes a second transistor having a gate connected to the control voltage.

14. The system of claim 13, wherein the processor includes a graphics processor in communication with memory and a central processing unit.

\* \* \* \* \*